United States Patent
Chiang et al.

(10) Patent No.: US 7,622,347 B2
(45) Date of Patent: Nov. 24, 2009

(54) SELF-ALIGNED METAL ELECTRODE TO ELIMINATE NATIVE OXIDE EFFECT FOR METAL INSULATOR SEMICONDUCTOR (MIS) CAPACITOR

(75) Inventors: Min-Hsiung Chiang, Taipei County (TW); Chih-Ta Wu, Hsinchu (TW); Tsung-Hsun Huang, Taipei County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 555 days.

(21) Appl. No.: 11/622,506

(22) Filed: Jan. 12, 2007

(65) Prior Publication Data
US 2007/0111438 A1   May 17, 2007

Related U.S. Application Data

(62) Division of application No. 10/861,148, filed on Jun. 4, 2004, now Pat. No. 7,180,116.

(51) Int. Cl.
  *H01L 21/8242* (2006.01)
(52) U.S. Cl. ............... 438/239; 257/303; 257/E27.093
(58) Field of Classification Search ............ 438/239, 438/244, 253, 396; 257/300, 303, 305, E27.048, 257/E27.093, E21.653
See application file for complete search history.

(56) References Cited

U.S. PATENT DOCUMENTS

| 5,741,734 | A | 4/1998 | Lee |
| 6,168,984 | B1 | 1/2001 | Yoo et al. |
| 6,468,855 | B2 | 10/2002 | Leung et al. |
| 6,661,049 | B2 | 12/2003 | Tzeng et al. |
| 6,841,821 | B2 * | 1/2005 | Hsu ........................ 257/305 |

* cited by examiner

*Primary Examiner*—David Vu
(74) *Attorney, Agent, or Firm*—Thomas, Kayden, Horstemeyer & Risley (57) ABSTRACT

A method of forming a capacitor comprising the following steps. An inchoate capacitor is formed on a substrate within a capacitor area whereby portions of the substrate separate the inchoate capacitor from isolating shallow trench isolation (STI) structures. STIs. A first dielectric layer is formed over the structure. The first dielectric layer is patterned to: form a portion masking the inchoate capacitor; and expose at least portions of the STIs and the substrate portions separating the inchoate capacitor from the shallow trench isolation structures. Metal portions are formed at least over the substrate portions. A second dielectric layer is formed over the patterned first dielectric layer portion, the metal portions and the STIs, whereby the metal portions formed at least over the substrate portions prevent formation of native oxide on at least the substrate portions. The invention also includes the structures formed thereby.

27 Claims, 6 Drawing Sheets

*Initial Structure Common to Both Embodiments*

FIG. 1

*First Embodiment*

Second Embodiment

SELF-ALIGNED METAL ELECTRODE TO ELIMINATE NATIVE OXIDE EFFECT FOR METAL INSULATOR SEMICONDUCTOR (MIS) CAPACITOR

CROSS REFERENCE TO RELATED APPLICATIONS

This application is a division of pending U.S. patent application Ser. No. 10/861,148, filed Jun. 4, 2004 and entitled "SELF-ALIGNED METAL ELECTRODE TO ELIMINATE NATIVE OXIDE EFFECT FOR METAL INSULATOR SEMICONDUCTOR (MIS) CAPACITOR".

FIELD OF THE INVENTION

The present invention relates generally to semiconductors and more specifically to metal insulator semiconductor (MIS) capacitors.

BACKGROUND OF THE INVENTION

In traditional metal insulator semiconductor (MIS) dynamic random access memory (DRAM) devices, high temperature nitridation before the high dielectric constant (k) deposition is needed to prevent bottom electrode oxidation during the high-k deposition. It is noted that a high dielectric constant (k) is above about 3.9.

The major concern is to eliminate native oxide and to increase capacitance. However, a high temperature anneal is not acceptable for embedded DRAM because logic performance will be degraded.

U.S. Pat. No. 6,580,115 B2 to Agarwal describes a capacitor electrode for integrating high-k materials (wherein high-k materials have a dielectric of greater than about 20).

U.S. Pat. No. 5,663,098 to Creighton et al. describes a method for deposition of a conductor in integrated circuits.

U.S. Pat. No. 4,751,101 to Joshi describes low stress tungsten films by silicon reduction of $WF_6$.

SUMMARY OF THE INVENTION

Accordingly, it is an object of one or more embodiments of the present invention to provide an improved method of eliminating native oxide formation in the formation of metal insulator semiconductor (MIS) capacitors.

Other objects will appear hereinafter.

It has now been discovered that the above and other objects of the present invention may be accomplished in the following manner. Specifically, a substrate including a capacitor area isolated by shallow trench isolation structures formed within shallow trench isolation structure trenches is provided. An inchoate capacitor is formed on the substrate within the capacitor area whereby portions of the substrate separate the inchoate capacitor from the shallow trench isolation structures. A first dielectric layer is formed over the substrate, the shallow trench isolation structures and the inchoate capacitor. The first dielectric layer is patterned to: form a patterned first dielectric layer portion masking the inchoate capacitor; and expose at least portions of the shallow trench isolation structures and the substrate portions separating the inchoate capacitor from the shallow trench isolation structures. Metal portions are formed at least over the substrate portions. A second dielectric layer is formed over the patterned first dielectric layer portion, the metal portions and the shallow trench isolation structures whereby the metal portions formed at least over the substrate portions prevent formation of native oxide on at least the substrate portions. The capacitor is then completed. The invention also includes the structures formed thereby.

BRIEF DESCRIPTION OF THE DRAWINGS

The present invention will be more clearly understood from the following description taken in conjunction with the accompanying drawings in which like reference numerals designate similar or corresponding elements, regions and portions and in which:

FIGS. 1 and 2 to 6 schematically illustrate a first preferred embodiment of the present invention.

FIGS. 1 and 7 to 11 schematically illustrate a second preferred embodiment of the present invention.

DETAILED DESCRIPTION OF THE PREFERRED EMBODIMENT

Initial Structure Common to Both the First and Second Embodiments

FIG. 1

Figure 1:
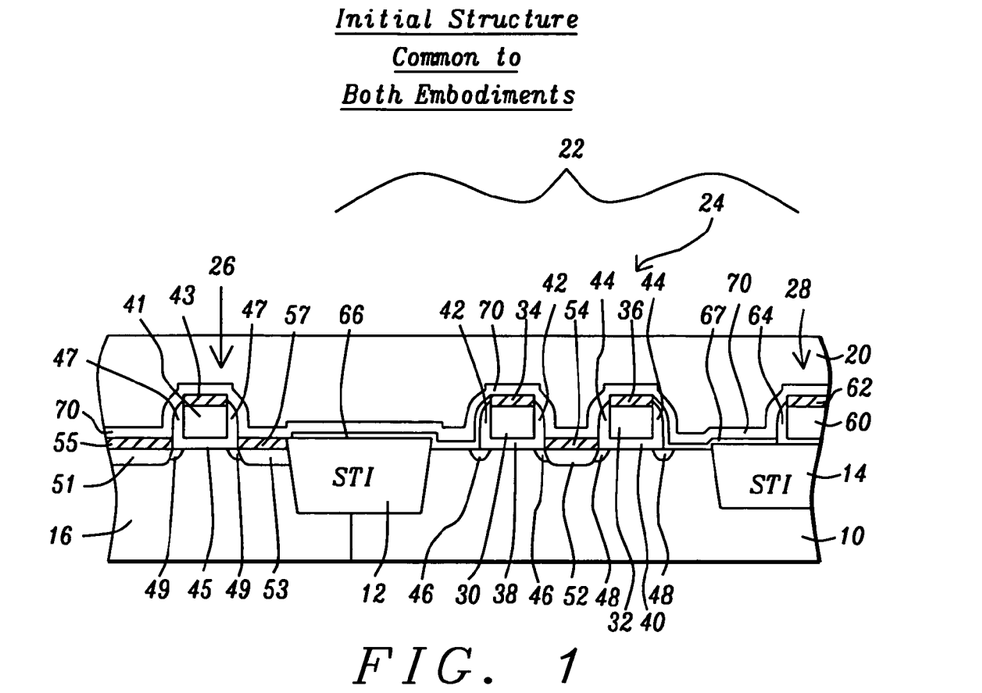
FIG. 1 schematically illustrate an initial structure common to both the first and second preferred embodiments of the present invention.

FIG. 1 illustrates the initial structure common to both the first and second embodiments of the present invention which illustrates a standard logic process up past the interlevel dielectric (ILD) layer 20 planarization, preferably by chemical mechanical polishing (CMP).

Substrate 10 is divided by a first shallow trench isolation (STI) 12 and a second shallow trench isolation (STI) 14, for example, with an N/P well region 16 and a cell region 18. Within the cell region 18, an inchoate capacitor 24 is formed within a capacitor area 22. Inchoate capacitor 24 includes dual gate electrodes 30, 32 with: respective overlying silicide portions 34, 36; respective underlying gate oxide portions 38, 40; and respective sidewall spacers 42; 44. Pairs of LDD implants 46, 48 are formed within the substrate 10 are outboard of the respective gate electrodes 30, 32 and a central source/drain (S/D) implant 52 is formed within the substrate 10 is between the gate electrodes 30, 32 and includes a silicide portion 54 thereover formed on the substrate 10.

First device 26 may be formed on substrate 10 over N/P well region 16. First device 26 may include a gate electrode 41 with an overlying silicide portion 43 and an underlying gate oxide portion 45, sidewall spacers 47, LDD implants 49, source and drain implants 51, 53 with respective overlying silicide portions 55, 57.

Second device 28 may be formed on STI 14 and includes gate electrode 60 with an overlying silicide portion 62 and sidewall spacers 64.

Substrate 10 is preferably comprised of silicon or germanium and is more preferably silicon. Silicide portions 34, 36, 54; 43, 55, 57; 62 are preferably comprised of cobalt silicide ($CoSi_x$) titanium silicide ($TiSi_x$) or nickel silicide ($NiSi_x$) and are more preferably cobalt silicide ($CoSi_x$).

Respective resist protect oxide (RPO) portions 66, 67 are formed outboard from silicide portions 34, 36 over dual gate electrodes 30, 32 over: (1) the outboard sidewall spacers 42, 44; (2) the adjacent portions of substrate 10; and (3) over at least a portion of the adjacent STIs 12, 14. RPO portions 66, 67 are preferably comprised of oxide or silicon oxide and more preferably oxide and have a thickness of preferably from about 30 to 700 Å and more preferably from about 150 to 400 Å.

An etch stop layer 70 is then formed over the RPO portions 66, 67, inchoate capacitor 24, first device 26, second device 28 and suicide portions 54, 55, 57 to a thickness of preferably from about 50 to 700 Å and more preferably from about 300 to 500 Å. Etch stop layer 70 is preferably comprised of a composite film oxide/silicon oxynitride (SiON).

A planarized interlevel dielectric layer (ILD) 20 is then formed over the etch stop layer 70 to a thickness of preferably from about 5000 to 12,000 Å and more preferably from about 8000 to 10,000 Å. ILD layer 20 is preferably planarized by chemical mechanically polishing (CMP). ILD layer 20 is preferably comprised of oxide.

The structure of FIG. 1 is then used in respective first (FIGS. 2 to 6) and second (FIGS. 7 to 11) embodiments as described below.

In the first embodiment of the present invention, the crown patterning step to open the capacitor area 22 also patterns portions of the respective STI's 12, 14 while in the second embodiment of the present invention, the crown patterning step to open the capacitor area 22 does not pattern the respective STI's 12, 14.

First Embodiment

FIGS. 2 to 6

Figure 2:
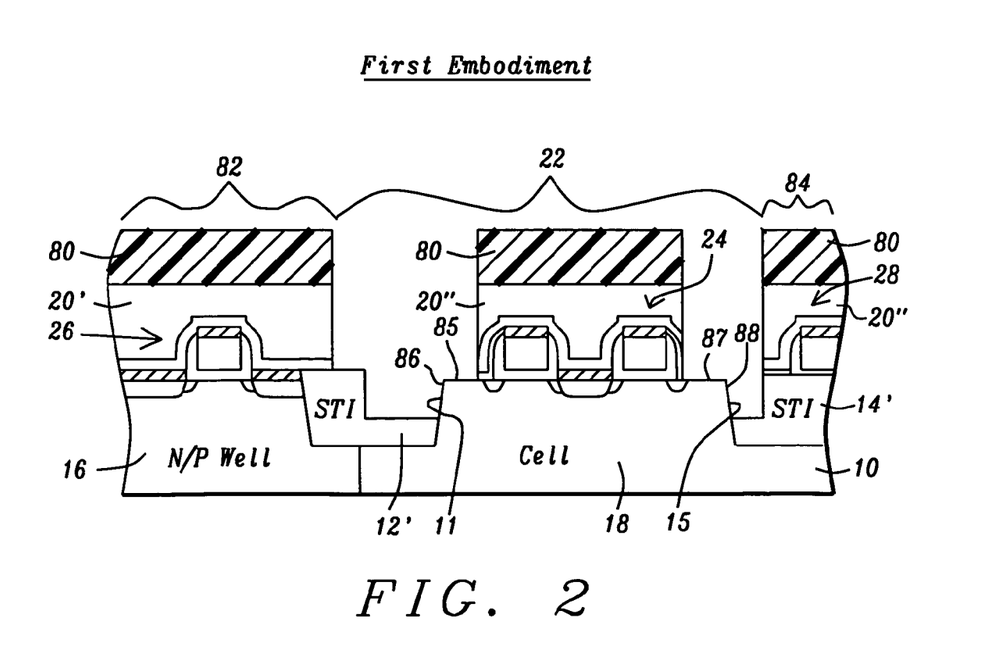

Crown Patterning Step and Patterning of STI's 12, 14—FIG. 2

As shown in FIG. 2, a patterned masking layer 80 (that is preferably comprised of photoresist) is formed over the ILD layer 20 to mask the inchoate capacitor 24 and the respective first and second device regions 82, 84 within which the first and second devices 26, 28 are formed and the ILD layer 20 is patterned to form patterned ILD portions 20', 20", 20''' and expose portions 85, 87 of the underlying substrate 10 and, in this first embodiment, portions of the respective STI's 12, 14 within the capacitor area 22 are also patterned to form patterned STI's 12', 14' exposing portions 86, 88 of the respective STI trenches 11, 15 within which the STI's 12, 14 were formed.

STI's 12, 14 are also patterned during this crown patterning step by: etching the ILD layer 20 and stopping on the etch stop layer 70; removing the exposed etch stop layer 70 in situ; etching substrate 10 to form STI trenches 11, 15; and then filling STI trenches 11, 15 to form STI's 12, 14.

Figure 3:
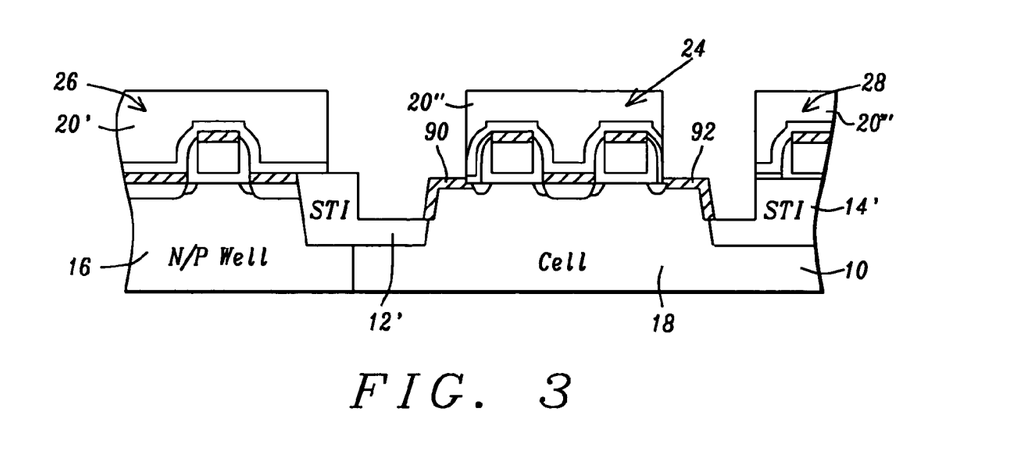

Formation of Respective Tungsten (W) Portions 90, 92 Over the Exposed Portions 85, 87 of Substrate 10 and Exposed Portions 86, 88 of the STI Trenches 11, 15—FIG. 3

As shown in FIG. 3, the patterned masking layer 80 is removed and the structure is cleaned as necessary.

Then, metal portions 90, 92 are formed over the exposed portions 85, 87 of substrate 10 and the exposed portions 86, 88 of the STI trenches 11, 15 to a thickness of preferably from about 10 to 300 Å and more preferably from about 100 to 200 Å. Metal portions 90, 92 are preferably formed using a selective metal deposition process so that metal is formed only on the exposed Si surfaces, without covering the shallow trench isolation structure, as shown in FIG. 3, and preferably comprise tungsten (W) formed using $WF_6$, provided that metal portions 90, 92 are formed at sufficiently low temperatures to prevent logic device degradation.

The reaction to form the tungsten (W) portions 90, 92 is based upon a CVD process and is believed to be:

These tungsten (W) portions 90, 92 will prevent oxidation of the otherwise exposed underlying portions 85, 86, 87, 88 of substrate 10 during the subsequent high-k dielectric layer 94 formation.

Figure 4:
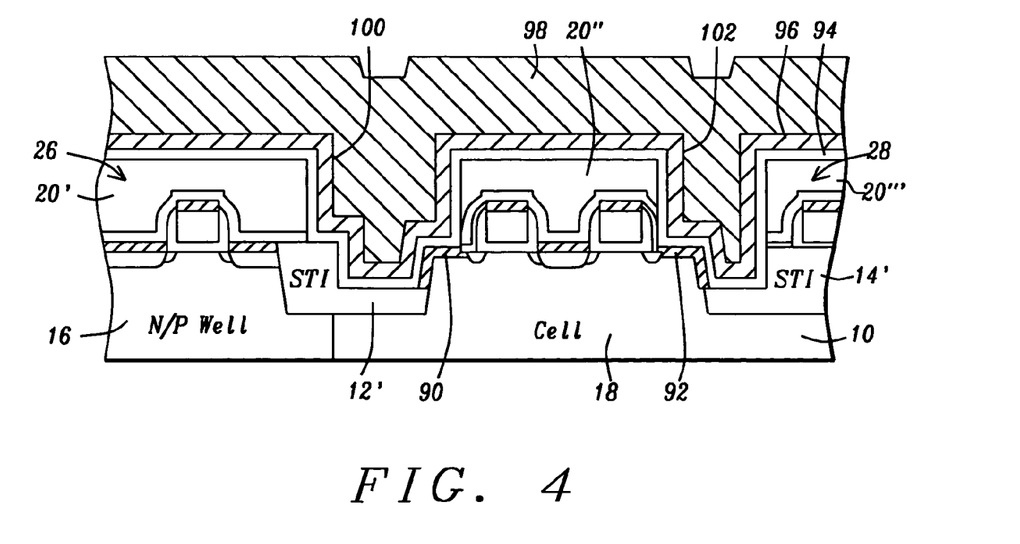

Formation of High-K Dielectric Layer 94, Barrier Layer 96 and Metal Layer 98—FIG. 4

As shown in FIG. 4, a high-k dielectric layer 94 (that is a dielectric layer having a dielectric constant (k) of greater than about 3.9 is formed over the structure of FIG. 3 to a thickness of preferably from about 10 to 200 Å and more preferably from about 50 to 100 Å. High-k dielectric layer 94 is preferably comprised of a composite film such as $Ta_2O_5/Al_2O_3$, $HfO_2/Al_2O_3$ or $Al_2O_3/HfO_2/Al_2O_3$; $Ta_2O_5$; $HfO_2$; $Al_2O_3$; $TiO_2$; $SrTiO_3$ or $ZrO_2$; and is more preferably a composite film such as $Ta_2O_5/Al_2O_3$ or $HfO_2/Al_2O_3$. or $Al_2O_3/HfO_2/Al_2O_3$.

It is noted that the tungsten (W) portions 90, 92 prevent oxidation of the underlying portions 85, 86, 87, 88 of substrate 10 during the formation of the high-k dielectric layer 94.

Preferably, a barrier layer 96 is then formed over high-k dielectric layer 94 to a thickness of preferably from about 15 to 300 Å and more preferably from about 100 to 200 Å. Barrier layer 96 is preferably comprised of TiN, TaN, WN, etc. and is more preferably TiN.

As shown in FIG. 4, a barrier layer lined plate opening 100 is positioned between inchoate capacitor 24 and first device 26 and a barrier layer lined plate opening 102 is positioned between inchoate capacitor 24 and second device 28.

Then, a metal plate layer 98 is formed over the barrier layer 96/high-k dielectric layer 94 to at least fill barrier layer lined plate openings 100, 102.

Metal plate layer 98 is preferably comprised of tungsten (W).

Figure 5:
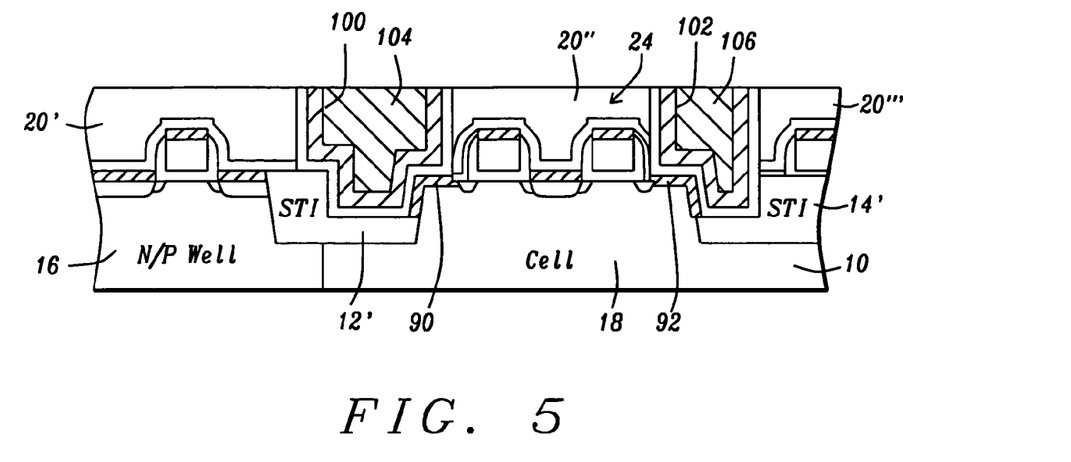

Planarization of Metal Plate Layer 98, Optional Barrier Layer 96 and High-K Dielectric Layer 94—FIG. 5

As shown in FIG. 5, metal plate layer 98, optional barrier layer 96 and high-k dielectric layer 94 are planarized, preferably by chemical mechanical polishing (CMP), to remove them from over the patterned ILD layer portions 20', 20", 20''' and to form metal plates 104, 106 within barrier layer lined plate openings 100, 102.

Figure 6:
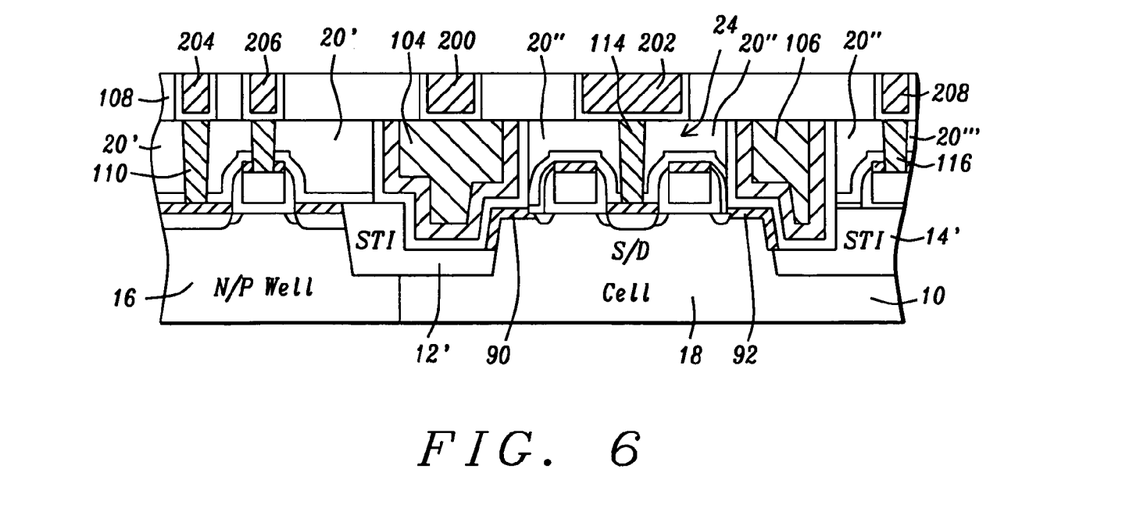

Formation of Contacts 110, 112, 114, 116 and Back End of Line (BEOL) Processing—FIG. 6

As shown in FIG. 6, various contacts 110, 112, 114, 116 may be formed through various patterned ILD portions 20', 20", 20''' to contact select source drains and/or gate electrodes such as shown.

Further back end of line (BEOL) processing may then proceed. For example, as shown in FIG. 6, an upper dielectric layer 108 may be formed over contacts 110, 112, 114, 116 and patterned ILD portions 20', 20", 20''' and: (1) plate pickups 200, 202 may be formed there through to contact respective metal plates 104, 106; and (2) pickups 204, 206, 208 may be formed there through to contact respective contacts 110, 112, 114, 116. As shown, plate pickups 200, 202 and pickups 204, 206, 208 may be barrier layer lined.

This completes formation of the capacitor 24'.

Second Embodiment

FIGS. 7 to 11

Figure 7:
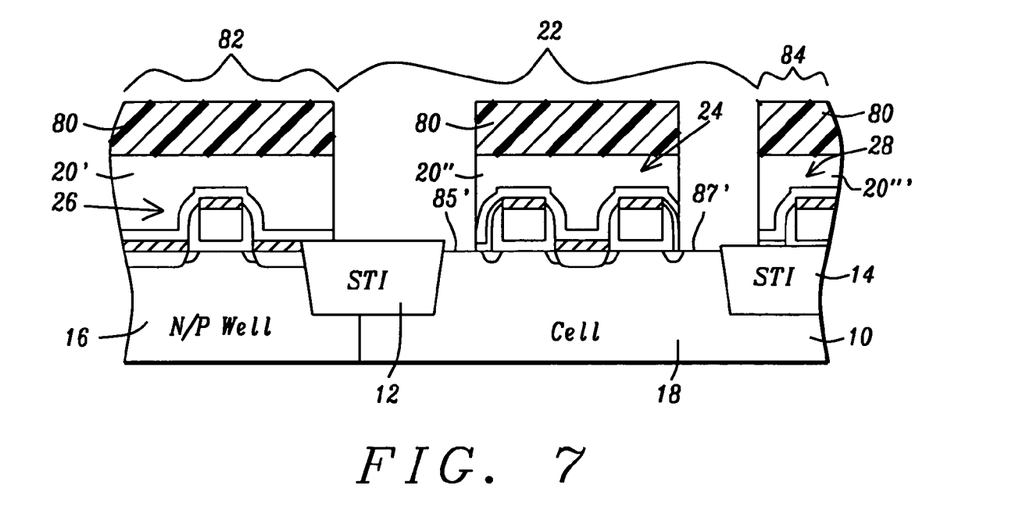

Crown Patterning Step—FIG. 7

As noted above, the second embodiment of the present invention is substantially the same as the first embodiment except that the crown patterning step in the second embodiment does not pattern the STI's 12, 14. As such like reference numbers will be used for like structures in the first embodiment.

As shown in FIG. 7, a patterned masking layer 80 (that is preferably comprised of photoresist) is formed over the ILD layer 20 to mask the inchoate capacitor 24 and the respective first and second device regions 82, 84 within which the first and second devices 26, 28 are formed and the ILD layer 20 is patterned to form patterned ILD portions 20', 20'', 20''' and expose portions 85', 87' of the underlying substrate 10.

Figure 8:
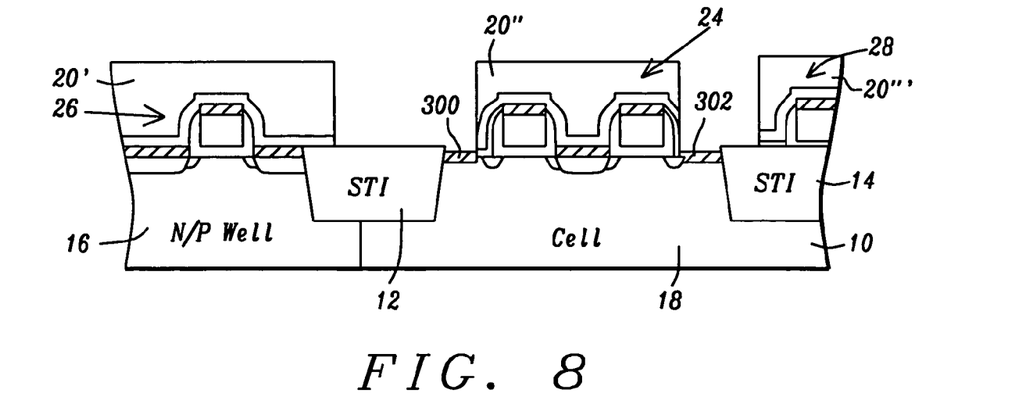

Formation of Respective Tungsten (W) Portions 300, 302 Over the Exposed Portions 85', 87' of Substrate 10—FIG. 8

As shown in FIG. 8, the patterned masking layer 80 is removed and the structure is cleaned as necessary.

Then, metal portions 300, 302 are formed over the exposed portions 85', 87' of substrate 10 to a thickness of preferably from about 10 to 300 Å and more preferably from about 100 to 200 Å. Metal portions 300, 302 are preferably formed using a selective metal deposition process so that metal is formed only on the exposed Si surfaces, without covering the shallow trench isolation structure, as shown in FIG. 8, and preferably comprise tungsten (W) formed using $WF_6$, provided that metal portions 300, 302 are formed at sufficiently low temperatures to prevent logic device degradation.

The reaction to form the tungsten (W) portions 300, 302 is based upon a CVD process and is believed to be:

$$2WF_6 + 3Si \rightarrow 2W + 3SiF_4$$

These tungsten (W) portions 300, 302 will prevent oxidation of the otherwise exposed underlying portions 85', 87' of substrate 10 during the subsequent high-k dielectric layer 94' formation.

Figure 9:
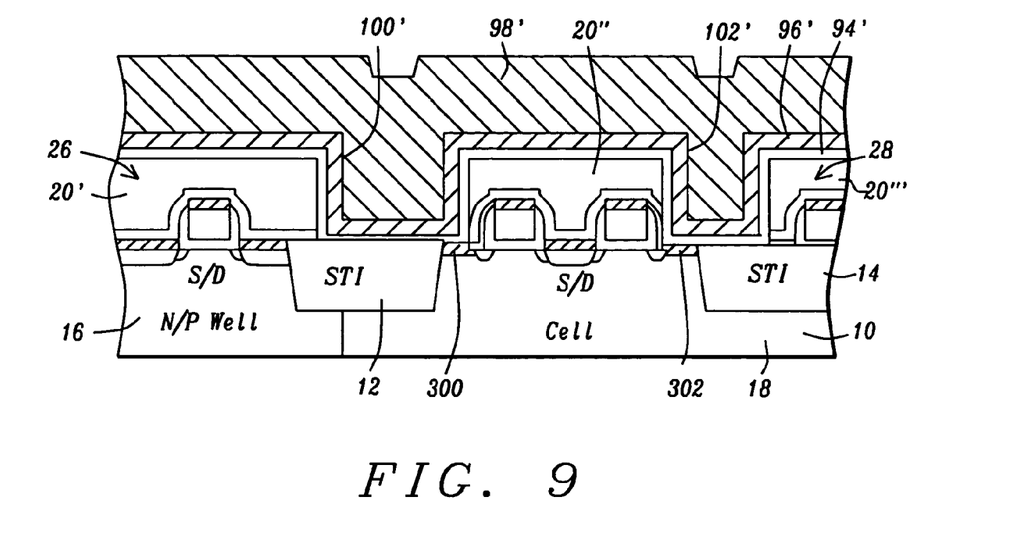

Formation of High-K Dielectric Layer 94', Barrier Layer 96' and Metal Layer 98'—FIG. 9

As shown in FIG. 9, a high-k dielectric layer 94' (that is a dielectric layer having a dielectric constant (k) of greater than about 3.9 is formed over the structure of FIG. 8 to a thickness of preferably from about 10 to 200 Å and more preferably from about 50 to 100 Å. High-k dielectric layer 94' is preferably comprised of a composite film such as $Ta_2O_5/Al_2O_3$, $HfO_2/Al_2O_3$ or $Al_2O_3/HfO_2/Al_2O_3$, etc.; $Ta_2O_5$; $HfO_2$; $Al_2O_3$; $TiO_2$; $SrTiO_3$; $ZrO_2$; etc. and is more preferably a composite film such as $Ta_2O_5/Al_2O_3$ or $HfO_2/Al_2O_3$. or $Al_2O_3/HfO_2/Al_2O_3$, etc.

It is noted that the tungsten (W) portions 300, 302 prevent oxidation of the underlying portions 85', 87' of substrate 10 during the formation of the high-k dielectric layer 94'.

Preferably, a barrier layer 96' is then formed over high-k dielectric layer 94' to a thickness of preferably from about 15 to 300 Å and more preferably from about 100 to 200 Å. Barrier layer 96' is preferably comprised of TiN, TaN, WN, etc. and is more preferably TiN.

As shown in FIG. 9, a barrier layer lined plate opening 100' is positioned between inchoate capacitor 24 and first device 26 and a barrier layer lined plate opening 102' is positioned between inchoate capacitor 24 and second device 28.

Then, a metal plate layer 98' is formed over the barrier layer 96'/high-k dielectric layer 94' to at least fill barrier layer lined plate openings 100', 102'.

Metal plate layer 98' is preferably comprised of tungsten (W).

Figure 10:
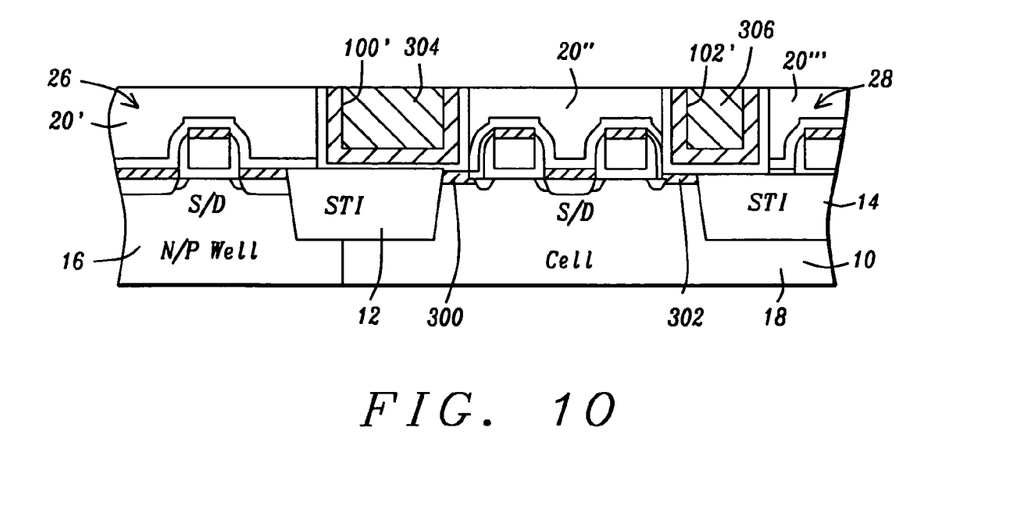

Planarization of Metal Plate Layer 98', Optional Barrier Layer 96' and High-K Dielectric Layer 94'—FIG. 10

As shown in FIG. 10, metal plate layer 98', optional barrier layer 96' and high-K dielectric layer 94' are planarized, preferably by chemical mechanical polishing (CMP), to remove them from over the patterned ILD layer portions 20', 20'', 20''' and to form metal plates 304, 306 within barrier layer lined plate openings 100', 102'.

Figure 11:
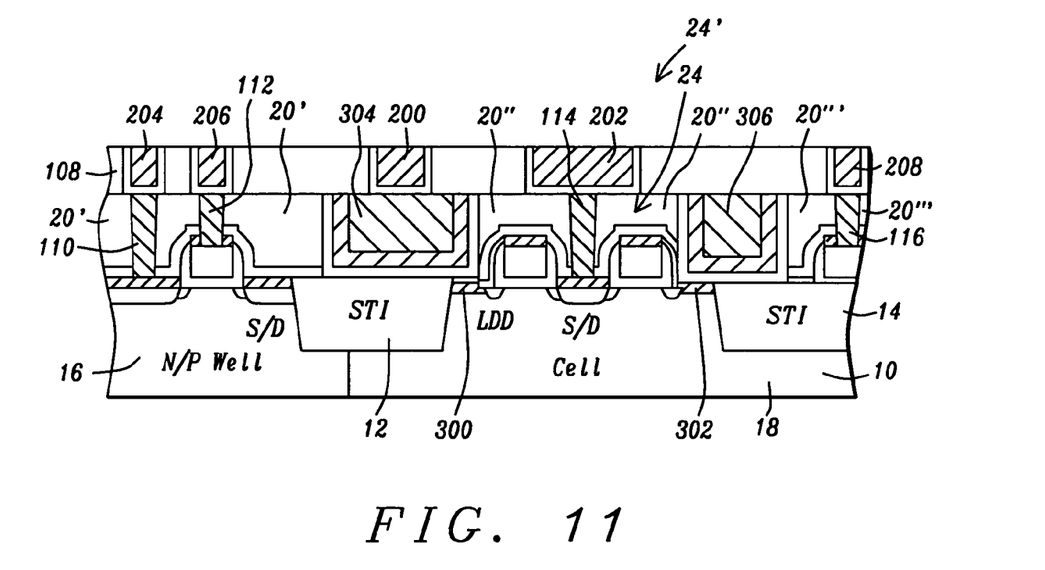

Formation of Contacts 110, 112, 114, 116 and Back End of Line (BEOL) Processing—FIG. 11

As shown in FIG. 11, various contacts 110, 112, 114, 116 may be formed through various patterned ILD portions 20', 20'', 20''' to contact select source drains and/or gate electrodes such as shown.

Further back end of line (BEOL) processing may then proceed. For example, as shown in FIG. 11, an upper dielectric layer 108 may be formed over contacts 110, 112, 114, 116 and patterned ILD portions 20', 20'', 20''' and: (1) plate pickups 200, 202 may be formed there through to contact respective metal plates 304, 306; and (2) pickups 204, 206, 208 may be formed there through to contact respective contacts 110, 112, 114, 116. As shown, plate pickups 200, 202 and pickups 204, 206, 208 may be barrier layer lined.

This completes formation of the capacitor 24'.

It is noted that the second embodiment is an extension of the first embodiment.

Advantages of the Present Invention

The advantages of one or more embodiments of the present invention include:

1. increase in capacitance due to the elimination of native oxide;
2. the cell size is shrinkable;
3. the same logic performance is maintained when using the embodiments of the present invention; and
4. an extra mask is not needed to define top electrode because a selective metal (W) formation is used as the bottom electrode with the metal (W) is only being formed on the exposed Si surface. (If a normal process were used to deposit the metal as the bottom electrode, an extra mask would be needed to define hi-k and the top electrode to avoid electrical short between the top and bottom electrodes.)

While particular embodiments of the present invention have been illustrated and described, it is not intended to limit the invention, except as defined by the following claims.

We claim:

1. A method of forming a capacitor, comprising the steps:
   providing a substrate including a capacitor area isolated by shallow trench isolation structures formed within shallow trench isolation structure trenches;
   forming an inchoate capacitor on the substrate within the capacitor area whereby portions of the substrate separate the inchoate capacitor from the shallow trench isolation structures;
   forming a first dielectric layer over the substrate, the shallow trench isolation structures and the inchoate capacitor;

patterning the first dielectric layer to:
  form a patterned first dielectric layer portion masking the inchoate capacitor; and
  expose at least portions of the shallow trench isolation structures and the substrate portions separating the inchoate capacitor from the shallow trench isolation structures;
forming metal portions at least over the substrate portions;
forming a second dielectric layer over the patterned first dielectric layer portion, the metal portions and the shallow trench isolation structures whereby the metal portions formed at least over the substrate portions prevent formation of native oxide on at least the substrate portions; and
completing formation of the capacitor.

2. The method of claim 1, wherein the substrate is comprised of silicon or germanium.

3. The method of claim 1, wherein the substrate is comprised of silicon.

4. The method of claim 1, wherein the first dielectric layer is an interlevel dielectric layer and the second dielectric layer has a dielectric constant of greater than about 3.9.

5. The method of claim 1, wherein the first dielectric layer is comprised of oxide; and the second dielectric layer is comprised of a composite film such as $Ta_2O_5/Al_2O_3$, $HfO_2/Al_2O_3$ or $Al_2O_3/HfO_2/Al_2O_3$; or $Ta_2O_5$; $HfO_2$; $Al_2O_3$; $TiO_2$; or $SrTiO_3$; $ZrO_2$.

6. The method of claim 1, wherein the first dielectric layer is comprised of oxide; and the second dielectric layer is comprised of a composite film such as $Ta_2O_5/Al_2O_3$ or $HfO_2/Al_2O_3$. or $Al_2O_3/HfO_2/Al_2O_3$.

7. The method of claim 1, wherein the second dielectric layer has a thickness of from about 10 to 200 Å and the metal portions have a thickness of from about 10 to 300 Å.

8. The method of claim 1, wherein the second dielectric layer has a thickness of from about 50 to 100 Å and the metal portions have a thickness of from about 100 to 200 Å.

9. The method of claim 1, including the step of forming an etch stop layer underneath the first dielectric layer.

10. The method of claim 1, including the step of forming an etch stop layer underneath the first dielectric layer; the etch stop layer having a thickness of from about 50 to 700 Å.

11. The method of claim 1, including the step of forming an etch stop layer underneath the first dielectric layer; the etch stop layer having a thickness of from about 300 to 500 Å.

12. The method of claim 1, wherein the metal portions are comprised of tungsten.

13. The method of claim 1, wherein the metal portions are comprised of tungsten using $WF_6$ as a precursor.

14. The method of claim 1, including the step of patterning at least a portion of the shallow trench isolation structures to expose at least portions of the respective shallow trench isolation trenches; and whereby metal portions are also formed on the exposed shallow trench isolation trench portions.

15. A method of forming a capacitor, comprising the steps:
providing a substrate including a capacitor area isolated by shallow trench isolation structures formed within shallow trench isolation structure trenches;
forming an inchoate capacitor on the substrate within the capacitor area whereby portions of the substrate separate the inchoate capacitor from the shallow trench isolation structures;
forming a first dielectric layer over the substrate, the shallow trench isolation structures and the inchoate capacitor;
patterning the first dielectric layer to:
  form a patterned first dielectric layer portion masking the inchoate capacitor; and
  expose at least portions of the shallow trench isolation structures and the substrate portions separating the inchoate capacitor from the shallow trench isolation structures;
forming tungsten portions at least over the substrate portions;
forming a second dielectric layer over the patterned first dielectric layer portion, the tungsten portions and the shallow trench isolation structures whereby the tungsten portions formed at least over the substrate portions prevent formation of native oxide on at least the substrate portions; and
completing formation of the capacitor.

16. The method of claim 15, wherein the substrate is comprised of silicon or germanium.

17. The method of claim 15, wherein the substrate is comprised of silicon.

18. The method of claim 15, wherein the first dielectric layer is an interlevel dielectric layer and the second dielectric layer has a dielectric constant of greater than about 3.9.

19. The method of claim 15, wherein the first dielectric layer is comprised of oxide; and the second dielectric layer is comprised of a composite film such as $Ta_2O_5/Al_2O_3$, $HfO_2/Al_2O_3$ or $Al_2O_3/HfO_2/Al_2O_3$; $Ta_2O_5$; $HfO_2$; $Al_2O_3$; $TiO_2$; or $SrTiO_3$; $ZrO_2$.

20. The method of claim 15, wherein the first dielectric layer is comprised of oxide; and the second dielectric layer is comprised of a composite film such as $Ta_2O_5/Al_2O_3$ or $HfO_2/Al_2O_3$. or $Al_2O_3/HfO_2/Al_2O_3$.

21. The method of claim 15, wherein the second dielectric layer has a thickness of from about 10 to 200 Å and the tungsten portions have a thickness of from about 10 to 300 Å.

22. The method of claim 15, wherein the second dielectric layer has a thickness of from about 50 to 100 Å and the tungsten portions have a thickness of from about 100 to 200 Å.

23. The method of claim 15, including the step of forming an etch stop layer underneath the first dielectric layer.

24. The method of claim 15, including the step of forming an etch stop layer underneath the first dielectric layer; the etch stop layer having a thickness of from about 50 to 700 Å.

25. The method of claim 15, including the step of forming an etch stop layer underneath the first dielectric layer; the etch stop layer having a thickness of from about 300 to 500 Å.

26. The method of claim 15, wherein the tungsten portions are formed using $WF_6$ as a precursor.

27. The method of claim 15, including the step of patterning at least a portion of the shallow trench isolation structures to expose at least portions of the respective shallow trench isolation trenches; and whereby metal portions are also formed on the exposed shallow trench isolation trench portions.

* * * * *